United States Patent
Cho et al.

(10) Patent No.: US 8,199,517 B2
(45) Date of Patent: Jun. 12, 2012

(54) FLEXIBLE PRINTED CIRCUIT BOARD, METHOD OF FABRICATING THE FLEXIBLE PRINTED CIRCUIT BOARD, AND DISPLAY DEVICE HAVING THE FLEXIBLE PRINTED CIRCUIT BOARD

(75) Inventors: Jeong-Min Cho, Hwaseong-si (KR); Gyung-Hyun Ko, Bucheon-si (KR); Heung-Suk Chin, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 379 days.

(21) Appl. No.: 12/480,173

(22) Filed: Jun. 8, 2009

(65) Prior Publication Data

US 2009/0308638 A1 Dec. 17, 2009

(30) Foreign Application Priority Data

Jun. 12, 2008 (KR) ........................ 10-2008-0055367

(51) Int. Cl.
*H05K 7/10* (2006.01)
*H05K 1/00* (2006.01)
*H05K 7/00* (2006.01)

(52) U.S. Cl. ........ 361/767; 174/254; 361/749; 361/777; 361/808

(58) Field of Classification Search .................. 174/254, 174/260, 261; 361/749–751, 760, 767, 773, 361/774, 777, 779, 808, 748; 427/98.5
See application file for complete search history.

(56) References Cited

U.S. PATENT DOCUMENTS

| | | | | | |
|---|---|---|---|---|---|
| 4,081,601 | A | * | 3/1978 | Dinella et al. | 174/257 |
| 5,308,928 | A | * | 5/1994 | Parla et al. | 174/261 |
| 5,453,581 | A | * | 9/1995 | Liebman et al. | 174/261 |
| 5,523,920 | A | * | 6/1996 | Machuga et al. | 361/767 |
| 5,534,667 | A | * | 7/1996 | Miyamoto et al. | 174/261 |
| 5,742,483 | A | * | 4/1998 | Ma et al. | 361/777 |
| 5,793,150 | A | * | 8/1998 | Kober et al. | 310/338 |
| 6,167,615 | B1 | * | 1/2001 | Ma et al. | 29/840 |
| 6,545,229 | B1 | * | 4/2003 | Ma et al. | 174/263 |
| 7,176,655 | B2 | * | 2/2007 | Kogan et al. | 320/112 |
| 2005/0098888 | A1 | * | 5/2005 | Akram | 257/738 |

* cited by examiner

*Primary Examiner* — Timothy Thompson
*Assistant Examiner* — Sherman Ng
(74) *Attorney, Agent, or Firm* — F. Chau & Associates, LLC

(57) ABSTRACT

Provided are a flexible printed circuit board (PCB), which can contribute to the reduction of damage to wiring layers and wiring defects regardless of a decrease in the width of wiring layers and can thus contribute to the miniaturization of various products, a method of fabricating the flexible PCB, and a display device having the flexible PCB. The flexible PCB includes a base film, one or more first pad patterns formed on the base film, one or more second pad patterns formed on the base film and connected to the one or more first pad patterns, a cover film formed on the one or more first pad patterns and the base film and exposing the one or more second patterns, and a plurality of expanded portions corresponding to the boundaries between the one or more first pad patterns and the one or more second pad patterns and having a greater width than the one or more first pad patterns and the one or more second pad patterns.

9 Claims, 5 Drawing Sheets

FLEXIBLE PRINTED CIRCUIT BOARD, METHOD OF FABRICATING THE FLEXIBLE PRINTED CIRCUIT BOARD, AND DISPLAY DEVICE HAVING THE FLEXIBLE PRINTED CIRCUIT BOARD

CROSS-REFERENCE TO RELATED APPLICATION

This application claims priority from Korean Patent Application No. 10-2008-0055367 filed on Jun. 12, 2008, the disclosure of which is hereby incorporated by reference herein in its entirety.

BACKGROUND OF THE INVENTION

1. Technical Field

The present disclosure relates to a flexible printed circuit board (PCB), a method of fabricating the flexible PCB, and a display device having the flexible PCB, and more particularly, to a flexible PCB which can contribute to the reduction of damage to wiring layers and wiring defects regardless of a decrease in the width of wiring layers and can thus contribute to the miniaturization of various products, a method of fabricating the flexible PCB, and a display device having the flexible PCB.

2. Description of the Related Art

The demand for the miniaturization of various products equipped with display devices, such as, for example, mobile phones, portable navigation devices or digital cameras, has steadily grown. Liquid crystal displays (LCDs) are deemed one of the most suitable display devices for miniaturizing such various products.

In general, display devices may include a display panel displaying an image, a backlight assembly providing light to the display panel and a printed circuit board (PCB) equipped with a controller for generating various electric signals necessary for driving the display panel.

In the meantime, it may be necessary to reduce the size of flexible PCBs to keep up with the trend of miniaturization of display device modules. However, to reduce the size of flexible PCBs, the pitch between wiring layers may need to be minimized.

As the pitch between wiring layers of a flexible PCB decreases, the thickness of wiring layers may also decrease. Thus, as a result, bending cracks are highly likely to be generated during the assembly of a display device. To address the above bending crack difficulties, an alloy of gold or silver obtained by substitution plating may be used. In this case, however, as the thickness of wiring layers and the pitch between wiring layers decrease, wiring layers become more likely to be damaged by a plating solution.

Therefore, it may be necessary to develop a method of minimizing the thickness of wiring layers and the pitch between wiring layers while preventing the occurrence of bending cracks and damage by a plating solution.

SUMMARY OF THE INVENTION

Exemplary embodiments of the present invention may provide a flexible printed circuit board (PCB) which can contribute to the reduction of damage to wiring layers and wiring defects regardless of a decrease in the width of wiring layers and can thus contribute to the miniaturization of various products.

Exemplary embodiments of the present invention may also provide a method of fabricating a flexible PCB which can contribute to the reduction of damage to wiring layers and wiring defects regardless of a decrease in the width of wiring layers and can thus contribute to the miniaturization of various products.

Exemplary embodiments of the present invention may also provide a display device having a flexible PCB which can contribute to the reduction of damage to wiring layers and wiring defects regardless of a decrease in the width of wiring layers and can thus contribute to the miniaturization of various products.

In accordance with an exemplary embodiment of the present invention, a flexible printed circuit board (PCB) is provided. The flexible PCB includes a base film, one or more first pad patterns formed on the base film, one or more second pad patterns formed on the base film and connected to the one or more first pad patterns, a cover film formed on the one or more first pad patterns and the base film and exposing the one or more second patterns and a plurality of expanded portions corresponding to the boundaries between the one or more first pad patterns and the one or more second pad patterns and having a greater width than the one or more first pad patterns and the one or more second pad patterns.

In accordance with an exemplary embodiment of the present invention, a method of fabricating a flexible printed circuit board (PCB) is provided. The method includes forming a plurality of pad patterns by patterning a metal film on a base film, each of the pad patterns including an expanded portion, depositing a cover film on the base film and the pad patterns, partially removing the cover film so that the pad patterns and the expanded portions are partially exposed and forming a plurality of first pad patterns and a plurality of second pad patterns by immersing the base film in a plating solution.

In accordance with an exemplary embodiment of the present invention, a display device is provided. The display device includes a display panel displaying an image, a printed circuit board (PCB) applying an image signal to the display panel and a flexible PCB connecting the display panel and the PCB. The flexible PCB comprising a base film, one or more first pad patterns formed on the base film, one or more second pad patterns formed on the base film and connected to the one or more first pad patterns, a cover film formed on the one or more first pad patterns and the base film and exposing the one or more second patterns, and a plurality of expanded portions corresponding to the boundaries between the one or more first pad patterns and the one or more second pad patterns and having a greater width than the one or more first pad patterns and the one or more second pad patterns.

BRIEF DESCRIPTION OF THE DRAWINGS

Exemplary embodiments of the present invention can be understood in more detail from the following description taken in conjunction with the attached drawings, in which.

DETAILED DESCRIPTION OF THE EXEMPLARY EMBODIMENTS OF THE INVENTION

Figure 1:
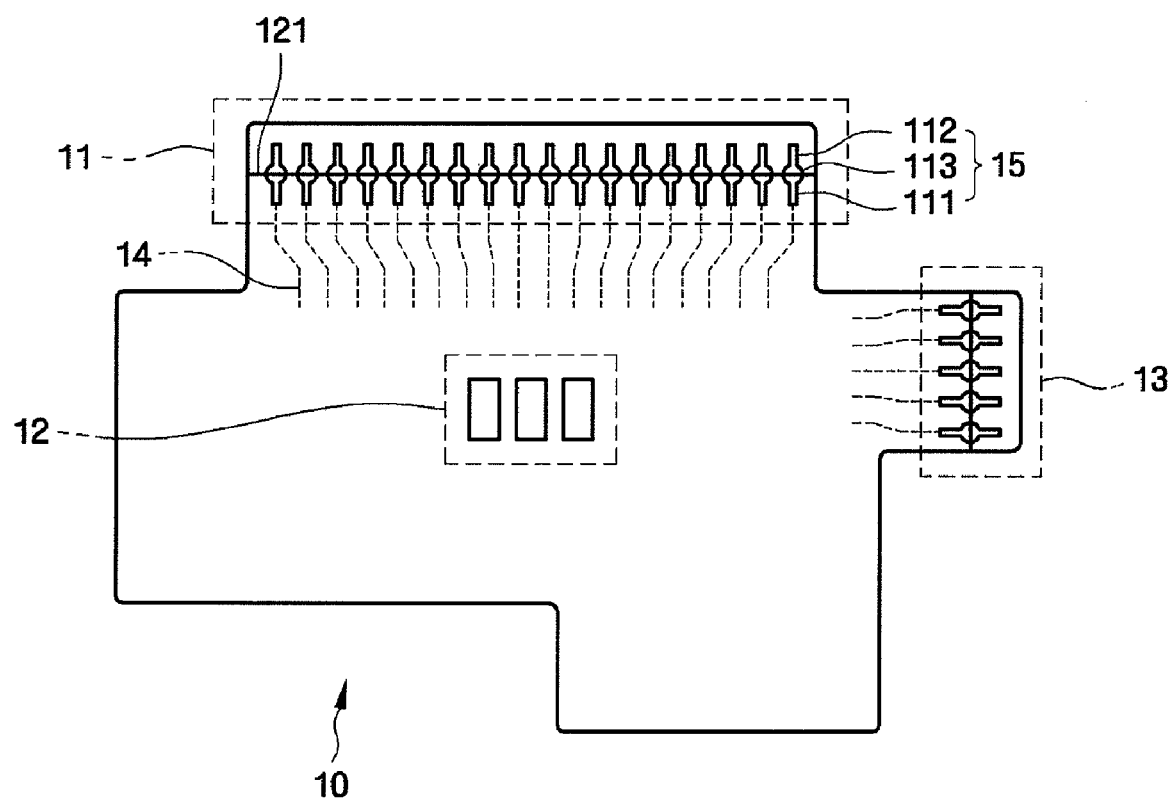
FIG. 1 illustrates a plan view of a flexible printed circuit board (PCB) according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein. In the drawings, like reference numerals indicate like elements.

Figure 2:
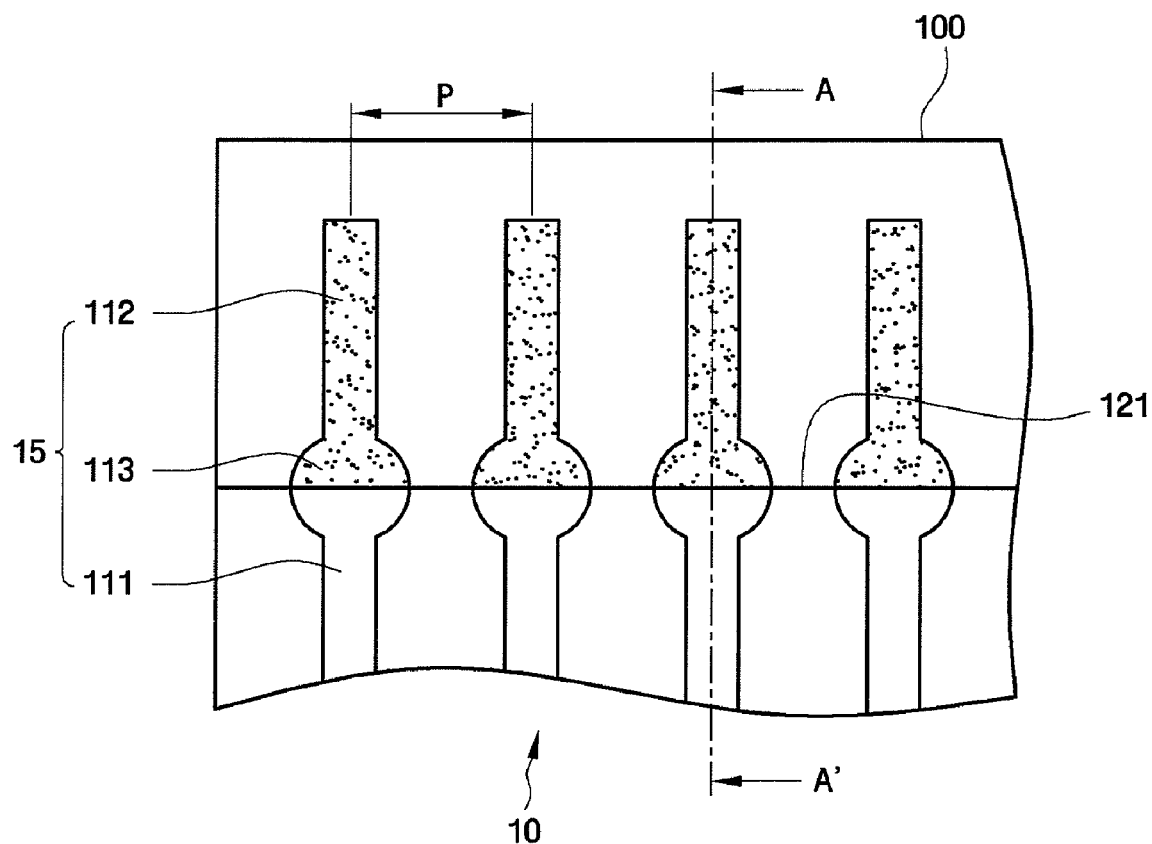
FIG. 2 illustrates an enlarged plan view of a first or second pad module shown in FIG. 1.
Figure 3:
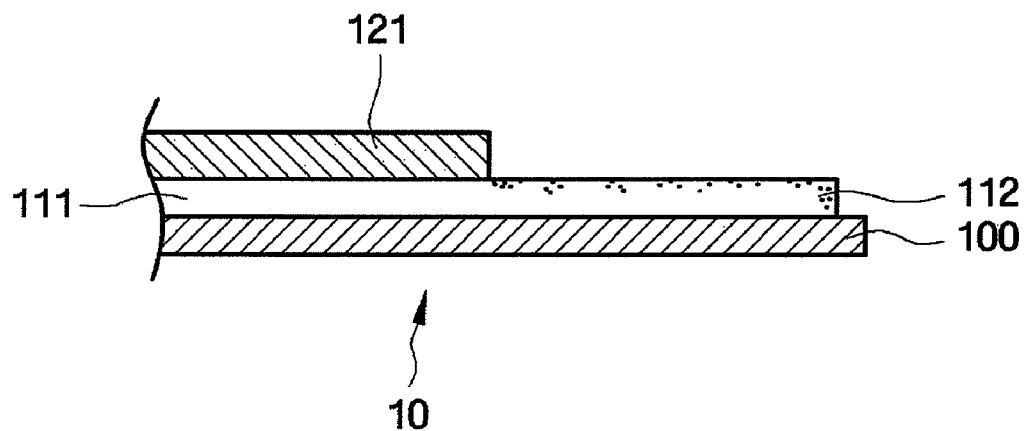
FIG. 3 illustrates a cross-sectional view taken along A-A' of FIG. 2.

A flexible printed circuit board (PCB) according to an exemplary embodiment of the present invention will hereinafter be described in detail with reference to FIGS. 1 through 3. FIG. 1 illustrates a plan view of a flexible PCB 10 according to an exemplary embodiment of the present invention, FIG. 2 illustrates an enlarged plan view of an exemplary embodiment of a first or second pad module 11 or 13 shown in FIG. 1, and FIG. 3 illustrates a cross-sectional view taken along A-A' of FIG. 2.

Referring to FIG. 1, the flexible PCB 10 may connect various elements or may provide signals to various elements by including a circuit module 12. The flexible PCB 10 may be formed of a flexible material and may thus be appropriately bent and mounted in a device. The flexible PCB 10 may be formed by, for example, depositing a plurality of wiring layer patterns 14 and a cover film 121 on a base film 100. The flexible PCB 10 includes the first pad module 11, the second pad module 13, and the circuit module 12.

The first pad module 11 and the second pad module 13 may partially expose electrodes and may thus connect the electrodes to an external element through contact with the external element. The circuit module 12 is mounted in the middle of the flexible PCB 10. The circuit module 12 may generate or process various signals. In addition, the circuit module 12 may provide various signals to an external device through the first pad module 11 and the second pad module 13 or may receive various signals from an external device through the first pad module 11 and the second pad module 13.

Each of the first and second pad modules 11 and 13 includes the base film 100, a plurality of pad patterns 15, and the cover film 121. Each of the pad patterns 15 includes a first pad pattern 111 and a second pad pattern 112.

The base film 100 may be formed of a material having flexible and dielectric properties. For example, the base film 100 may be a polyimide film, a polyester film, or a p-phenylene vinylene film.

The wiring layer patterns 14 may be formed of a conductive material on the base film 100 through patterning. For example, the wiring layer patterns 14 may be formed of a metal such as copper (Cu) or may include a metal film plated with tin (Sn), nickel (Ni) or solder.

A metal film may be formed on the base film 100 through, for example, casting, laminating, or electroplating. Casting may be characterized by, for example, applying a liquid base film on a rolling metal film and thermosetting the liquid base film. Laminating may be characterized by, for example, thermally compressing a base film on a rolling metal film. Electroplating may be characterized by, for example, depositing a metal seed layer on a base film, placing the base film in an electrolyte having metal ions, and applying electricity to the electrolyte so as to form a metal film on the base film. In an embodiment, a metal film may be formed on the base film 100 by, for example, compressing a base film and a metal film using two metallic rollers.

The wiring layer patterns 14 may be formed by, for example, depositing a metal layer on the base film 100 and performing photolithography on the metal layer so as to selectively etch the metal film and thus to pattern the metal film.

The cover film 121 may be deposited on the base film 100 and the wiring layer patterns 14. The cover film 121 may be formed, facing the base film 100. The cover film 121 may prevent the wiring layer patterns 14 from being polluted with foreign materials or being oxidized in the air. The cover film 121 may partially expose the first pad module 11 and the second pad module 13.

Referring to FIGS. 2 and 3, the first pad module 11 includes the base film 100, a plurality of pad patterns 15, and the cover film 121.

The pad patterns 15 may be connected to the wiring layer patterns 14, may be formed on the base film 100, and may be connected to external elements. Each of the pad patterns 15 may include a first pad pattern 111, a second pad pattern 112 and an expanded portion 113.

First ends of the first pad patterns 111 are connected to the wiring layer patterns 14, and second ends of the first pad patterns 111 are connected to the second pad patterns 112. The first pad patterns 111 may be wider than the wiring layer patterns 14, and may be formed of the same material as that of the wiring layer patterns 14. That is, the first pad patterns 111 may be formed by patterning the same metal film used to form the wiring layer patterns 14. The cover film 121 may be deposited on the first pad patterns 111. The cover film 121 may be formed using the same method used to deposit a metal layer on the base film 100.

First ends of the second pad patterns 112 are connected to the first pad patterns 111. As the cover film 121 is not formed on the second pad patterns 112, the second pad patterns 112 may serve as electric contacts for external elements.

The second pad patterns 112 may have, for example, a double- or triple-layer structure. For example, when the second pad patterns 112 have a double-layer structure including an upper layer and a lower layer, the lower layer, like the first pad patterns 111, may include a copper film, and the upper layer may include a plating layer formed of at least one of gold and silver.

Moreover, for example, when the second pad patterns 112 have a triple layer structure including a lower layer, a middle layer and an upper layer, the lower layer may include a copper film, the middle layer may include silver, and the upper layer may include gold. The middle layer may be formed to a thickness of, for example, about 0.1-about 0.2 μm, and the upper layer may be formed to a thickness of, for example, about 0.03-about 0.1 μm.

The second pad patterns 112 may be formed through, for example, electroless substitution plating by immersing the first pad patterns 111 in a gold plating solution and a silver plating solution. For example, the flexible PCB 10 with the cover film 121 partially removed is immersed in a silver plating solution. Then, a silver substitution plating reaction by which copper is substituted by silver may occur. The silver substitution plating reaction may be represented by Formula (1):

$$Cu \rightarrow Cu2+ 2e-$$

$$Ag++e- \rightarrow Ag$$

$$Ag+(aq)+½Cu(s) \rightarrow Ag(s)+½Cu2+(aq) \qquad (1).$$

Thereafter, the flexible PCB 10 is immersed in a gold plating solution. Then, a gold substitution plating reaction by which copper is substituted by gold may occur. The gold substitution plating reaction may be represented by Formula (2):

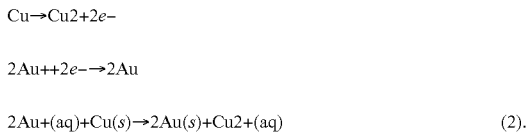

$$Cu \rightarrow Cu2+2e-$$

$$2Au++2e- \rightarrow 2Au$$

$$2Au+(aq)+Cu(s) \rightarrow 2Au(s)+Cu2+(aq) \quad (2).$$

For example, the second pad patterns 112 may be exposed by the cover film 121, and may be connected to a display panel and a PCB through an anisotropic conductive film (ACF), which is formed on the second pad patterns 112. The anisotropic conductive film is conductive in one direction and is dielectric in another direction. The anisotropic film may be formed by, for example, dispersing conductive particles in an adhesive material that can be hardened. When the anisotropic conductive film is inserted between electrodes and then is compressed, a current may flow in the anisotropic conductive film due to the conductive particles, but no current may flow along x- and y-directions.

The expanded portions 113 are formed between the first pad patterns 111 and the second pad patterns 112. The expanded portions 113 may be formed to be wider than the first pad patterns 111 and the second pad patterns 112. The expanded portions 113 may form the boundaries between the first pad patterns 111 and the second pad patterns 112. Parts of the expanded portions 113 connected to the first pad patterns 111 are not covered by the cover film 121. That is, parts of the expanded portions 113 covered by the cover film 121 include the same material as that of the first pad patterns 111. The parts of the expanded portions 113 not covered by the cover film 121 may be plated with gold and silver through gold and silver substitution plating and may thus include the same materials as those of the second pad patterns 112. The expanded portions 113 include the boundaries between portions of the pad patterns 15 covered with the cover film 121 and portions of the pad patterns 15 not covered with the cover film 121. The boundaries between the portions of the pad patterns 15 covered with the cover film 121 and the portions of the pad patterns 15 not covered with the cover film 121 may be vulnerable to gold substitution plating and silver substitution plating, thereby possibly causing a metal film to be damaged by a plating solution. However, as the expanded portions 113 have a greater width than the first pad patterns 111 and the second pad patterns 112, the expanded portions 113 may be prevented from being disconnected even when being damaged by a plating solution. The expanded portions 113 may be arranged in a straight line.

Figure 4:
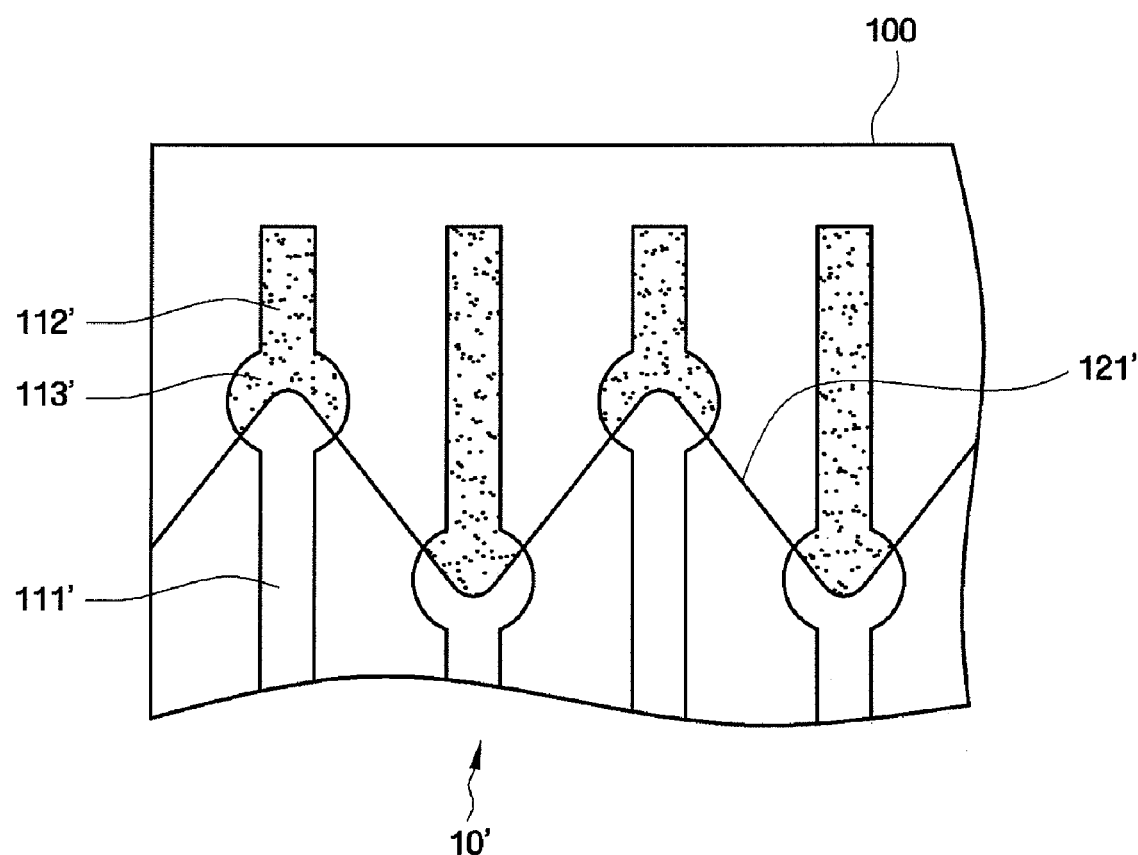
FIG. 4 illustrates an enlarged plan view of a first or pad module of a flexible PCB according to an exemplary embodiment of the present invention.

A flexible PCB according to one exemplary embodiment of the present invention will hereinafter be described in detail with reference to FIG. 4. FIG. 4 illustrates an enlarged plan view of a first or pad module of a flexible PCB 10' according to one exemplary embodiment of the present invention. Referring to FIG. 4, the flexible PCB 10' includes a plurality of pad patterns. Each of the pad patterns 15 includes an expanded portion 113'. The flexible PCB 10' is almost the same as the flexible PCB 10 except that the expanded portions 113' are arranged in a zigzag pattern. FIGS. 1 through 4, like reference numerals indicate like elements, and thus, detailed descriptions thereof will be omitted.

The expanded portions 113 may be arranged in, for example, a zigzag pattern. That is, the distance between a pair of adjacent expanded portions 113' may be greater than the distance between a pair of adjacent pad patterns 15'. In this case, it is possible to prevent the pair of adjacent expanded portions 113' from being short-circuited during the patterning of the pad patterns 15'. However, exemplary embodiments of the present invention are not restricted to this. That is, the expanded portions 113 may be arranged in various manners other than that set forth herein.

A method of fabricating a flexible PCB according to an exemplary embodiment of the present invention will hereinafter be described in detail with reference to FIGS. 5A through 5E. FIGS. 5A through 5E illustrate cross-sectional views for explaining a method of fabricating a flexible PCB according to an exemplary embodiment of the present invention.

Figure 5A:
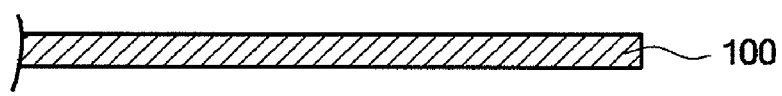
FIGS. 5A through 5E illustrate cross-sectional views for explaining a method of fabricating a flexible PCB according to an exemplary embodiment of the present invention.

Referring to FIG. 5A, a film having flexible and dielectric properties such as, for example, a polyimide film, a polyester film, or a p-phenylene vinylene film is prepared for as a base film 100.

Figure 5B:
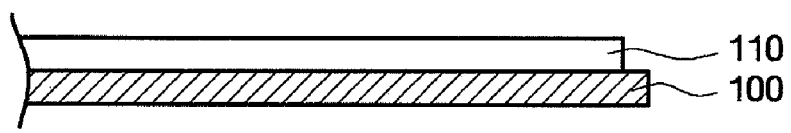

Thereafter, referring to FIG. 5B, a metal film is deposited on the base film 100 by using, for example, an adhesive or using a casting, laminating or electroplating method. Thereafter, a conductive pattern 110 is formed by, for example, patterning the metal film through photolithography. Examples of the conductive pattern 110 include the wiring layer patterns 14 and the pad patterns 15 shown in FIG. 1.

Figure 5C:
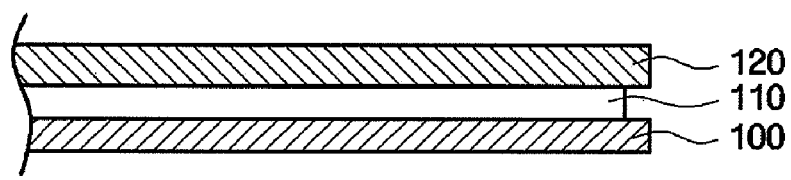

Thereafter, referring to FIG. 5C, a cover film 121 is deposited on the base film 100 and the conductive pattern 110. The cover film 121 may be formed of the same material as that of the base film 100 by using, for example, an adhesive or using a casting method.

Figure 5D:
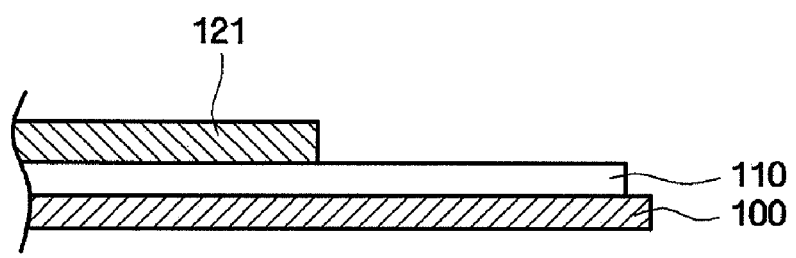

Thereafter, referring to FIG. 5D, the cover film 121 is partially removed so that the conductive pattern 110 can be partially exposed. The cover film 121 may be partially removed by using, for example, a mechanical method such as that involving the use of a grinder.

Part of the conductive pattern 110 covered by the cover film 121 may become a first pad pattern 111 shown in FIG. 2, and part of the conductive pattern 110 not covered by the cover film 121 may become a second pad pattern 112 shown in FIG. 2.

Figure 5E:
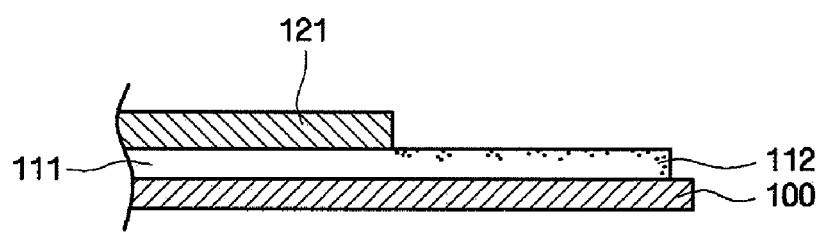

Thereafter, referring to FIG. 5E, a flexible PCB 10 shown in FIG. 5D may be immersed in, for example, a gold plating solution and then in a silver plating solution. Then, portions of the flexible PCB 10 are plated with gold and silver through gold and silver substitution plating, thereby forming a second pad pattern 112.

Figure 6:
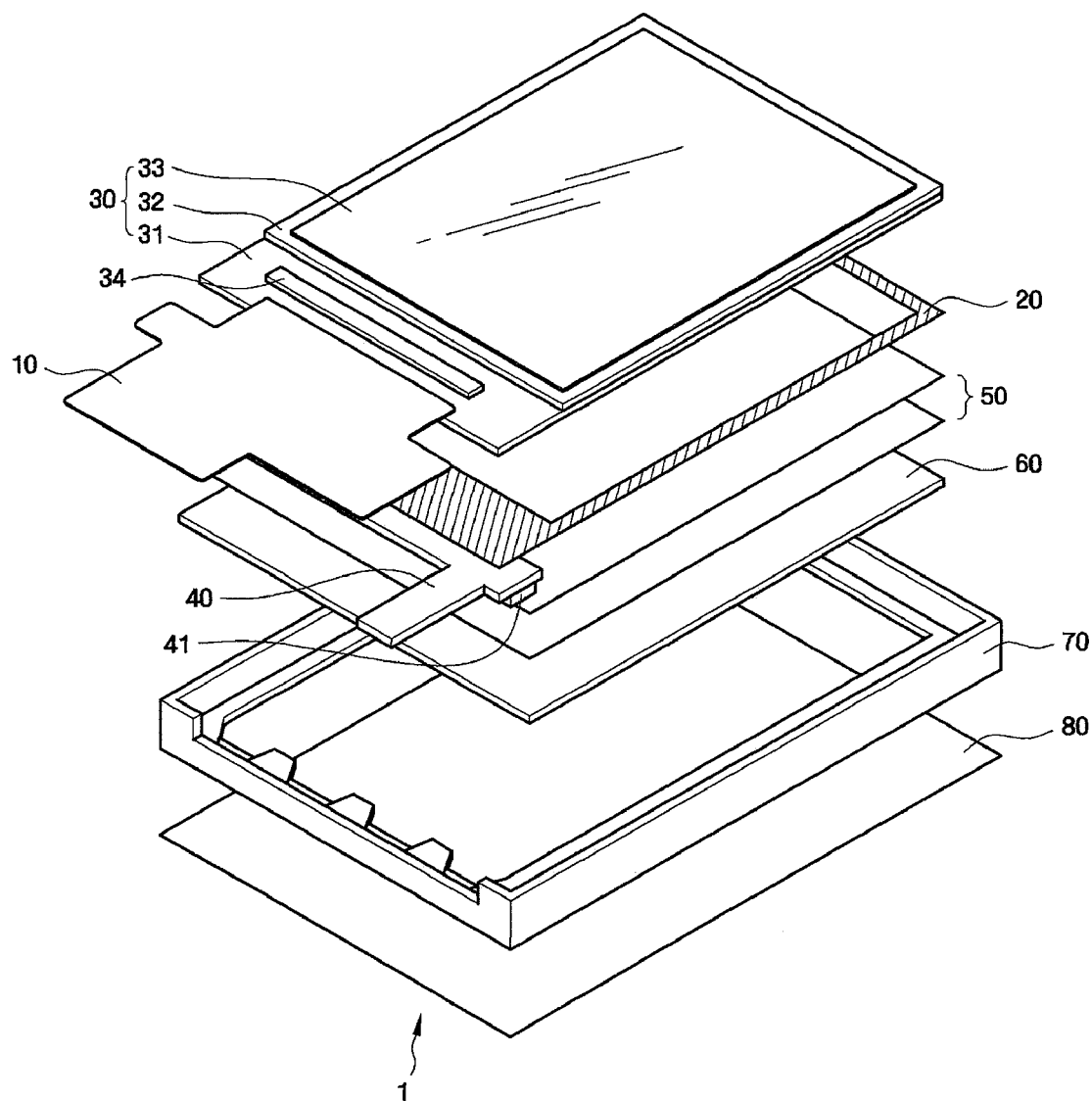
FIG. 6 illustrates an exploded view of a display device according to an exemplary embodiment of the present invention.

A display device according to an exemplary embodiment of the present invention will hereinafter be described in detail with reference to FIG. 6. FIG. 6 illustrates an exploded perspective view of a display device 1 according to an exemplary embodiment of the present invention.

Referring to FIG. 6, the display device 1 includes a display panel 30, a plurality of optical sheets 50, a light source unit 40, a waveguide plate 60, a frame 70, a flexible PCB 10, a reflective sheet 80 and an adhesive sheet 20.

The display panel 30 includes a lower display panel 31, an upper display panel 32, a polarizing film 33, a liquid crystal layer and a driver integrated circuit (IC) 34. The upper display panel 32 and the lower display panel 31 face each other, and the liquid crystal layer is interposed between the upper display panel 32 and the lower display panel 31.

The driver IC 34 is mounted on the lower display panel 31 as a chip. The driver IC 34 controls signals provided by the flexible PCB 10 and thus drives the display panel 30. The flexible PCB 10 may be connected to an external driving device.

The light source unit 40 provides light to the display panel 30. The light source unit 40 includes a light source 41. For example, a light-emitting diode (LED) may be used as the light source 41. The light source 41 may be mounted on a substrate.

However, the light source 41 is not restricted to an LED. That is, for example, a cold cathode fluorescent lamp (CCFL) or a hot cathode fluorescent lamp (HCFL) may also be used as the light source 41. The light source unit 40 may be fixed on the display panel 30 by the adhesive sheet 20.

The waveguide plate 60 guides light provided by the light source unit 40 toward the display panel 30. The waveguide plate 60 may be an edge-type waveguide plate guiding light emitted sideways toward the display panel 30, as illustrated in FIG. 6. In an embodiment, the waveguide plate 60 may be a direct-type waveguide plate guiding light emitted from below toward the display panel 30.

The waveguide plate 60 may be formed of a transparent plastic material such as, for example, polymethymethacrylate (PMMA).

The optical sheets 50 may include a diffusion sheet diffusing light and a prism sheet collecting light. The waveguide plate 60 and the optical sheets 50 may be contained in the frame 70.

The frame 70 has an open window in the middle of the frame 70. Thus, the frame 70 can transmit light therethrough, and the display panel 30 can be settled in the frame 70.

The frame 70 and the display panel 30 may be coupled by the adhesive sheet 20. An adhesive material may be applied on both surfaces of the adhesive sheet 20.

The reflective sheet 80 is disposed below the waveguide plate 60, and reflects light incident thereupon from the bottom of the waveguide plate 60 toward the display panel 30. The reflective sheet 80 may be coated with a highly-reflective material such as, for example, silver or aluminum.

Having described the exemplary embodiments of the present invention, it is further noted that various modifications can be made herein without departing from the spirit and scope of the invention as defined by the metes and bounds of the appended claims.

What is claimed is:

1. A flexible printed circuit board (PCB) comprising:
a base film;
one or more first pad patterns formed on the base film;
one or more second pad patterns formed on the base film and connected to the one or more first pad patterns;
a cover film formed on the one or more first pad patterns and the base film and exposing the one or more second pad patterns; and
a plurality of expanded portions corresponding to the boundaries between the one or more first pad patterns and the one or more second pad patterns and having a greater width than the one or more first pad patterns and the one or more second pad patterns, wherein the cover film overlaps a first portion of the plurality of expanded portions and does not overlap a second portion of the plurality of expanded portions.

2. The flexible PCB of claim 1, wherein each of the one or more second pad patterns is formed as one of a double layer or a triple layer including a plating layer comprising at least one of gold and silver.

3. The flexible PCB of claim 1, wherein each of the one or more first pad patterns comprises copper.

4. The flexible PCB of claim 3, wherein each of the one or more second pad patterns includes a lower layer comprising copper, a middle layer comprising silver, and an upper layer comprising gold.

5. The flexible PCB of claim 1, wherein the first portion of the plurality of expanded portions which is overlapped by the cover film is formed of a same material as the one or more first pad patterns and wherein the second portion of the plurality of expanded portions which is not overlapped by the cover film is formed of a same material as the one or more second pad patterns.

6. The flexible PCB of claim 1, wherein the plurality of expanded portions are arranged in a straight line.

7. The flexible PCB of claim 1, wherein a distance between a pair of adjacent expanded portions is greater than a distance between a pair of adjacent second pad patterns.

8. The flexible PCB of claim 7, wherein the expanded portions are arranged in zigzag pattern.

9. The flexible PCB of claim 1, wherein a first portion of the plurality of expanded portions are connected to the one or more first pad patterns and a second portion of the plurality of expanded portions are connected to the one or more second pad patterns.

\* \* \* \* \*